United States Patent
van Zanten

[11] 4,410,856
[45] Oct. 18, 1983

[54] FREQUENCY DEMODULATOR HAVING AUTOMATIC GAIN CONTROL

[75] Inventor: Francois van Zanten, Paris, France
[73] Assignee: Thomson - CSF, Paris, France
[21] Appl. No.: 217,235
[22] Filed: Dec. 17, 1980

[30] Foreign Application Priority Data
Dec. 21, 1979 [FR] France ................. 79 31485

[51] Int. Cl.³ .................. H03D 3/00; H04N 9/50
[52] U.S. Cl. .................. 329/50; 329/122; 329/136; 358/23
[58] Field of Search .......... 329/50, 110, 122, 124, 329/136; 455/214, 337; 358/23-25

[56] References Cited

U.S. PATENT DOCUMENTS 3,518,362 6/1970 Fessard .................. 358/23
3,863,264 1/1975 Nelson et al. .......... 358/11
3,873,923 3/1975 Iten et al. .......... 455/214 X

FOREIGN PATENT DOCUMENTS 2413913 10/1975 Fed. Rep. of Germany ........ 358/23

*Primary Examiner*—Siegfried H. Grimm
*Attorney, Agent, or Firm*—Roland Plottel

[57] ABSTRACT

A frequency demodulator circuit having an automatic gain control. The circuit will find particular use in SECAM color television receivers. The demodulator has two inputs; one receives alternately the reference frequency (during a sampling interval) and the frequency to be demodulated (between the sampling intervals). The other input receives a voltage for correcting the slope of the demodulator. The correcting signal is updated during each sampling and is provided by a feedback loop from the output of the demodulator, a reference frequency, and a reference voltage.

6 Claims, 3 Drawing Figures

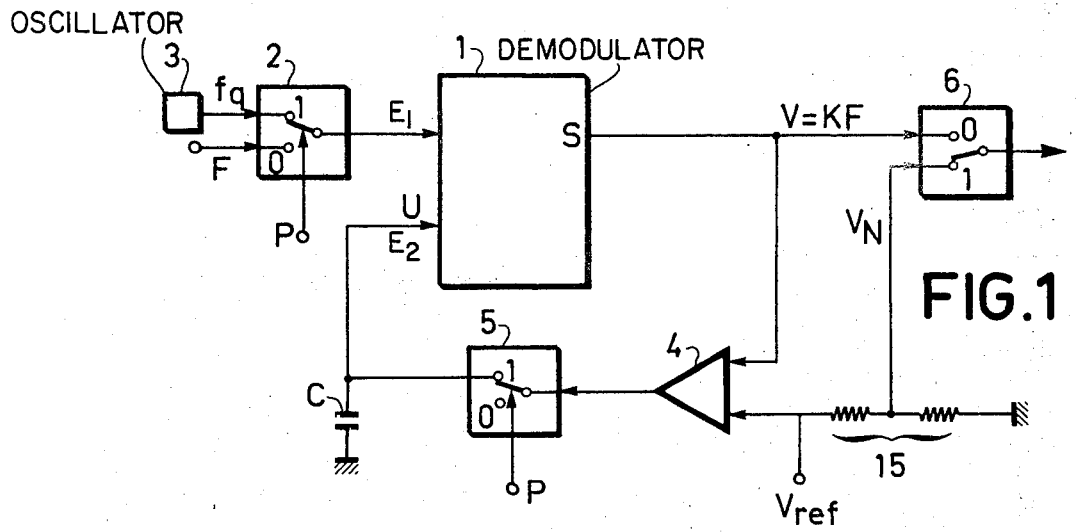
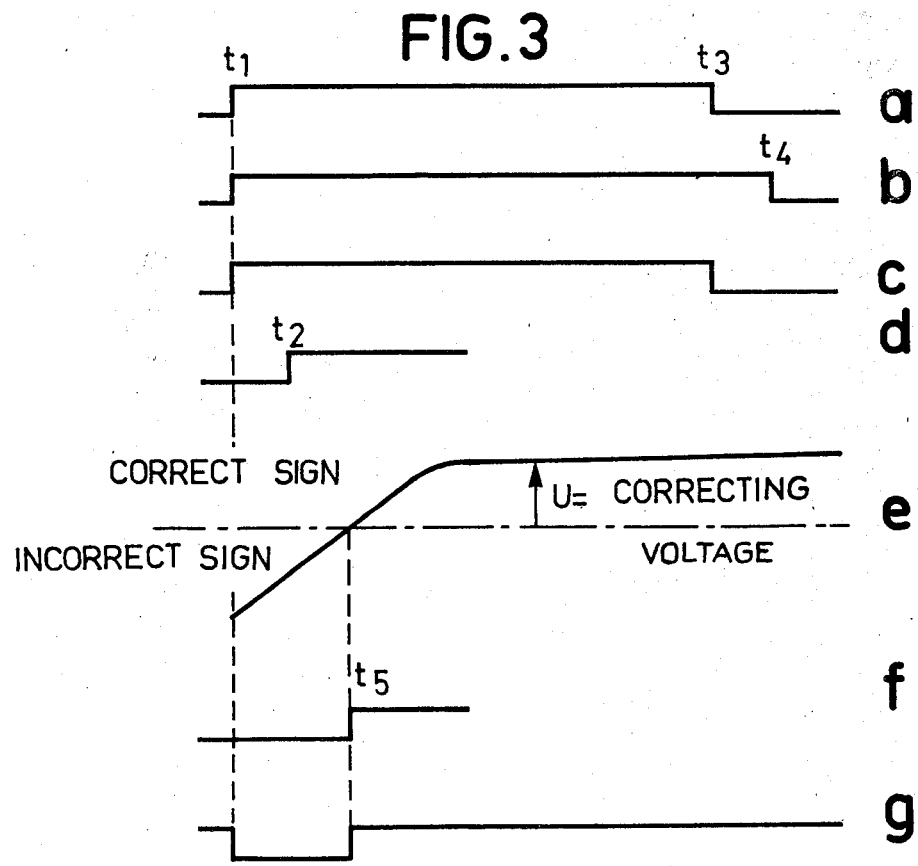

FREQUENCY DEMODULATOR HAVING AUTOMATIC GAIN CONTROL

BACKGROUND OF THE INVENTION

The present invention relates to frequency demodulation circuits, particularly for the field of color television and more especially for demodulation of the color subcarrier wave in SECAM receiving apparatus. It applies more particularly to control of the slope of the demodulator so as to do away with the adjustments, the thermal and time drifts and the manufacturing dispersions which affect the quality and the fidelity of reproduction of colors in SECAM receivers.

The problem resides in an antagonism between the results of manufacturing demodulators, especially with integrated technology, which result in a dispersed and unstable demodulation slope and the requirements for using these demodulators in SECAM television receivers which require a constant and stable slope. It is in fact imperative to restore accurately the DC component of the signal.

A solution of the prior art consists in using tuned circuits for constructing a demodulator of the FOOSTER SEELEY type, for example. This solution is not satisfactory for the following reasons: cost of the tuned circuits and especially cost of the adjustments, thermal and time drifts of the coils and condensers (despite trimming), large number of connection terminals between the integrated circuit and the external components.

Another solution of the prior art consists in forming a demodulator by means of a phase-control loop (oscillator + phase comparator). This solution, which constitutes nevertheless a progress with respect to the preceding one, is affected by the same type of defect: the demodulation slope depends on the components which determine the natural frequency of the oscillator. The precision and the stability of these components, even placed outside the integrated circuit, are insufficient, resulting in the need for adjustments. This dispersion over the demodulation slope has the further disadvantage of decentering the demodulation range with respect to the band to be demodulated. This demodulation range must then be increased so as to make sure that it contains the band of frequencies to be demodulated in the worst case of dispersion. But, increasing the demodulation range presents disadvantages: it is in fact known that in a phase-control loop, the increase in the pickup range is obtained by an increase in gain in an open loop, which makes the device more difficult to damp in a closed loop. The phase-control loop risks furthermore locking on parasite signals outside the effective band of the signal to be demodulated.

Among other attempts for doing away with adjustments and drifts, the sampled control of the response of the demodulator by the line-bursts or wave trains transmitted by the emitter at the beginning of each line may further be mentioned. The frequency of these line-bursts corresponds in fact to the level of the "black" (absence of color).

This latter arrangement is not satisfactory either for the following reasons:

the line-bursts only last 3.5 to 4 μs and their beginning cannot be used; in fact, in the first part of the line-bursts the demodulator is operating under transitory conditions. The sampling must not finish too late and encroach on the signal which follows the line-bursts. In practice, for good reliability, the sampling time will have to be less than 2 μs and accurately centered on the rear part of the line-bursts which involves a special circuit, not free from adjustments;

the line-bursts are affected by the propagation conditions, particularly by the parasite echoes which may induce interferences with the synchronizing "blips" which results in an incorrect demodulated level for achieving accurate control.

Moreover, in the SECAM system, the subcarrier wave, between 3.8 and 4.8 MHz, taken from the carrier wave, provides chrominance information in the form of two chrominance signals called B—Y and R—Y. The subcarrier wave is modulated in frequency and the colors are well reproduced if the output voltages of the demodulators are indeed indexed to the corresponding subcarrier frequencies delivered by the emitter, i.e. if the slope of the demodulators is well-defined and stable.

Similarly, when the emitter sends out nonoperating frequencies (corresponding to the absence of color) $F_{OR}$ for the red chrominance signal and $F_{OB}$ for the blue chrominance signal, the two demodulators must deliver a well-defined voltage for the grays to be pure and not colored.

SUMMARY OF THE INVENTION

The invention relates to the control of the gain of a demodulator with a view to obtaining a constant stable slope.

This control is tied up with a reference frequency, provided by a quartz oscillator and applied periodically to the demodulator so as to effect a sampled correction of the slope thereof.

The demodulator comprises two inputs:

one receives alternately the reference frequency (during the sampling times) and the frequency to be demodulated (between these times);

the other receives a voltage which constitutes a signal for correcting the slope of the demodulator; this voltage acts as a multiplier of the input frequency to be demodulated so as to produce at the output of the demodulator an output voltage proportional both to the frequency received at the first input and the voltage received at the second input.

The correction signal is established during the sampling times; it is memorized and used between these times. It is established from a feedback loop which examines, during the sampling times, the output voltage of the demodulator at the very time when this latter receives a reference frequency, and which compares this output voltage with a reference voltage so as to produce a correction signal depending on this comparison.

In practice, the sampling times correspond to the dead periods of the image signal: line return time or frame return time.

In other words, the present invention proposes a demodulation device for supplying a voltage proportional to a frequency, this device comprising:

a demodulator having a first input for receiving a frequency to be demodulated, a second input for receiving a correction voltage and an output supplying a voltage proportional, to within a factor, to the frequency at the first input and to the voltage at the second input, a feedback loop between the output of the demodulator and its second input, this loop comprising a differential amplifier having one input receiving the output of the demodulator and another input receiving a reference voltage, and a means for memorizing the output voltage of the differential amplifier, this means being connected to the second input of the demodulator, an oscillator supplying a reference frequency, a sampling means for applying, during sampling times, the reference frequency to the first input of the demodulator and for closing the feedback loop and for applying, outside these times, the frequency to be demodulated to the first input of the demodulator and for opening the feedback loop.

An astute way of forming the two-input modulator is to use a phase-locking control loop comprising a controlled-frequency oscillator and a phase comparator; this latter controls the frequency of the oscillator, by acting on a control voltage thereof, so as to make this frequency equal to the frequency to be demodulated. The output voltage of the phase comparator which serves as voltage for controlling the oscillator is then automatically proportional to the frequency to be demodulated simply as a result of the frequency-voltage linearity of the oscillator. In other words, instead of directly constructing a circuit supplying an output voltage proportional to an input frequency, a phase comparator is used which is looped by means of an oscillator whose output frequency is proportional to an input voltage. It is this input voltage of the oscillator which serves as output to the demodulator and which is proportional to the frequency of the oscillator therefore to the frequency to be demodulated to which the oscillator is slaved by the phase comparator.

Better still, the oscillator is an oscillator whose frequency is controlled by two voltages and which receives voltages at two inputs and which supplies an output frequency proportional to the ratio of these two voltages. The first voltage is the one which has already been mentioned, this is the output voltage of the phase comparator, which also constitutes the output voltage of the demodulator. The second voltage is the one which is applied to the second input of the demodulator which is simply one of the inputs of the oscillator.

The first input of the demodulator is formed by one of the inputs of the phase comparator (whose other input receives the output of the oscillator).

A simple construction is known of an oscillator controlled by two input voltages and supplying a frequency proportional to the ratio between these voltages: a relaxation oscillator is used comprising a means for charging and discharging a DC capacitor between two voltage levels (or between 0 and a reference level).

One of the inputs of the oscillator serves for receiving a variable voltage which defines a variable deviation between the two voltage levels (or the reference level). The other input serves for receiving a voltage which defines proportionally the current for charging and discharging the capacitor. Therefore, the relaxation oscillator delivers a frequency inversely proportional to the first voltage and proportional to the current so to the second voltage.

According to yet another characteristic of the invention, a safety circuit is provided whose function is to allow closing of the feedback loop of the demodulation device only if the memorized voltage applied to the second input of the demodulator is in the correct direction and so to avoid the phase-control circuit from departing from the pickup range.

DESCRIPTION OF THE DRAWINGS

The invention will be better understood from the description of one example of application given hereafter, which refers to the figures which represent:

FIG. 1, a simplified diagram of the demodulator of the invention, with its feedback loop;

FIG. 3, timing charts.

DESCRIPTION OF THE PREFERRED EMBODIMENT

Figure 2:
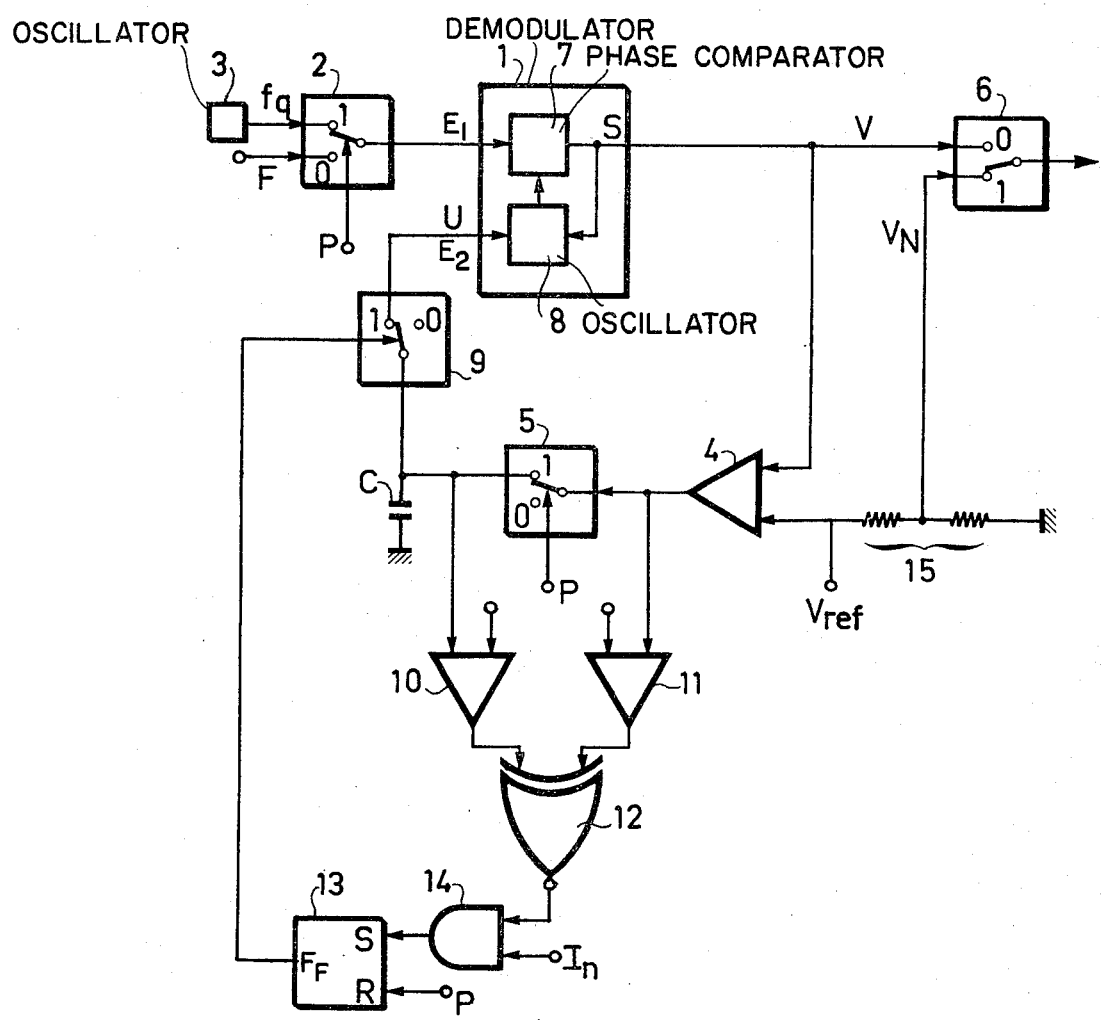
FIG. 2, a complete diagram of the phase loop of the invention, provided with a safety circuit.

FIG. 1 is a functional block diagram of the basic circuit of the invention. This simplified diagram will be completed by improvements outlined further on and referring to the following figures.

A demodulator 1, comprising esentially a phase-control loop, receives at its input $E_1$ a frequency F and delivers at its output S a voltage V:

$$V = KF.$$

To obtain a stable black level and stable colors, in the SECAM system of color television, the coefficient K must be stable and accurate. This result may be obtained by using for the demodulator discrete components of very high accuracy and by effecting an adjustment. Nevertheless, this constitutes in no way a progress in the direction of integration of the circuits, since the outside components are more expensive and involve an integrated-circuit case having more connections, so more expensive also.

So as to be free of the inaccurate coefficient K, there is effected during the "dead periods", such as line or frame returns, a feedback on a reference frequency, obtained from a quartz. To obtain a very precise frequency is easy and inexpensive, from widely used quartz, such as those used in telephony or as internal calibrating elements in some television systems; a quartz frequency of $f_q = 4.43$ MHz is particularly convenient for this embodiment.

Thus, the demodulator of the invention has two inputs: at one input $E_1$ it receives a frequency F and at an input $E_2$ it receives a voltage U. Its output voltage is, to within a factor, the product of the frequency by the voltage:

$$V = k\,FU$$

or $V = KF$ if we assume $kU = K$

The coefficient k has the dimensions of the reciprocal of a frequency: k is homogeneous at a time constant. The coefficient K is constant if voltage U varies in the reverse direction of k. U is the voltage of the feedback correction signal.

To determine K accurately, the reference frequency of the quartz, $f_q$, is fed on each line or frame return to the input $E_1$ of the demodulator, in place of the frequency F to be demodulated, and the output voltage V is compared with a reference voltage. The device is thus calibrated and the correction voltage is stored in memory.

FIG. 1 represents a demodulator 1 comprising two inputs $E_1$ and $E_2$ and an output S. An electronic switch 2 connects input $E_1$ to a voltage coming from a quartz oscillator 3 of frequency $f_q$ or to the frequency to be demodulated F. The output S is connected to the first input of a feedback amplifier 4 whose output is applied to input E$_2$ through an electronic switch 5. Input E$_2$ is also connected to ground through a storage capacitor C. The output S is also connected to an input of an electronic switch 6. The second input of amplifier 4 receives a reference voltage V$_{ref}$ one part of which (V$_N$) is applied by a potentiometer 15 to a second input of the electronic switch 6. The switches 2 and 5 are controlled by a line return or frame return pulse applied to an input P of the circuit. The signal at input E$_2$ is a correction voltage and is stored by capacitor C. The part V$_N$ of the reference voltage corresponds to the level of the black of the chrominance signal received by the demodulator.

Conventionally, to explain the operation of the circuit and in the rest of the text, it will be assumed that all the switches in FIG. 1 and following are in position:
  0 during the demodulation period;
  1 during the control period.

During the control period, i.e. during the frame (or line) return:
  reference frequency f$_q$ is fed to the demodulator;
  the error voltage U is such that the output voltage V of the demodulator is equal to V$_{ref}$, because amplifier 4 has a very high gain, and because its offset voltage is practically zero. We then have:

$$V = V_{ref} = k \, U \, f_q$$

$$U = (V_{ref}/k \, f_q)$$

During the demodulation period:
  the frequency to be demodulated F is transmitted to the demodulator;
  switch 5, in position 0, isolates capacitor C which holds in memory the value of U, i.e.:

$$(V_{ref}/k \, f_q)$$

The output voltage of the demodulator is:

$$V = k \, U \, F$$

$$\text{or } V = k \frac{V_{ref}}{k \, f_q} F = \frac{V_{ref}}{f_q} F = K F$$

The coefficient K is perfectly defined since equal to a reference voltage divided by a standard frequency.

In fact, the reference voltage does not even need to be accurate because, after the demodulator, comes a so-called cleaning or insertion circuit by means of which the black level V$_N$ is reinserted into the signal, during the first 10 microseconds of each line. This reinsertion takes place at switch 6 in FIG. 1. Since it is the same voltage V$_{ref}$ which serves for demodulating the chrominance signals and for reinserting the black level obtained by the potentiometric divider 15, inaccuracy with respect to the reference does not occur and the colors are stable: V$_{ref}$ and V$_N$ vary in the same direction, without changing the relative levels of the black and of the demodulated color.

The description of the operation which has just been outlined assumes that the pass-control loop has "latched on" to the input frequency F, and that the frequency of the oscillator is equal to the input frequency of the phase comparator.

FIG. 2 shows, in addition to the elements of FIG. 1, particularly a safety device, with logic organization, which prevents the phase loop from "unlatching" during sampling.

The demodulator 1 is a phase-control loop, formed by a phase comparator 7 and a voltage-controlled oscillator 8. The phase comparator delivers a voltage depending on the difference between its two inputs. The voltage-controlled oscillator 8 is for example a multivibrator (not shown) able to be formed by the linear charging and discharging of a condenser (not shown) between two voltage levels: this condenser is charged and discharged with a DC current until a given high level and a given low level are reached. A level detector (not shown) triggers the change of sign of the current when the low or high level is reached, so that charging and discharging is repeated at a constant frequency. This frequency is proportional to the amplitude of the charging and discharging current; it is inversely proportional to the difference between the low and high levels. The control voltage U (coming from storage capacitor C) defines this difference. The output voltage V of the phase comparator defines (proportionally) the charging and discharging current, for example through a resistor in series with a transistor, and by using a current recopying transistor in series with the capacitor.

There exists a possibility that the voltage stored in capacitor C has not the correct direction for correcting the frequency dispersion of oscillator 8. In this case, the oscillator delivers a frequency outside the pickup range defined by the gain of phase comparator 7. The phase-control loop may then not operate and the device remains disabled in this condition. This condition may either be produced on starting up or be induced by a spurious signal during operation.

The safety device comprises a switch 9 inserted between capacitor C and the input E$_2$ of oscillator 8. This switch is controlled by a circuit comprising comparators 10 and 11, a complemented exclusive OR gate (or multiplier) 12, an AND gate 14 and an RS flip-flop 13. Comparator 10 receives on the one hand the voltage on capacitor C and on the other hand a reference voltage. Comparator 11 receives on the one hand the output of amplifier 4 and, on the other hand, a reference voltage. The outputs of comparators 10 and 11 are fed to gate 12 whose output is connected to an input of the AND gate 14. The other input of this AND gate 14 receives an inhibiting signal In. The output of AND gate 14 is fed to the S input of RS flip-flop 13 whose R input receives the signal from terminal P (line or frame return). The output from this flip-flop 13 controls switch 9.

The logic circuit shown in FIG. 2 allows the connection to be cut, by means of switch 9, between storage capacitor C and the input E$_2$ of the oscillator and to be closed again only if certain conditions are satisfied. In other words, at the beginning of the sampling period, switch 9 is open and will be closed if the charge of storage capacitor C is in the correct direction for offsetting the gain deviation of the demodulator with respect to the gain fixed by the reference frequency.

The sign of the charge of capacitor C, with respect to a reference voltage, is compared with the sign of the variation between the output voltage V and the reference voltage, i.e. is compared with the error signal at the output of the feedback amplifier 4. Switch 9 is maintained open as long as there is a difference of sign, which allows latching on of the loop. Latching on of the loop allows in its turn capacitor C to take on the correct charge. When the sign difference is canceled out, switch 9 is closed, by means which will be described further on. Capacitor C then takes on the charge required for obtaining the gain laid down and the device is ready to demodulate.

The two signs—that of the charge of capacitor C and that of the error signal—are taken from the two comparators 10 and 11. Comparator 10 supplies a logic 0 or a 1, according to the sign of the variation between the voltage on capacitor C and a reference voltage. Comparator 11 supplies a logic 0 or 1, depending on the sign of the variation between the error voltage, from amplifier 4, and a reference voltage. If the two signals are identical, gate 12 supplies a 1 and switch 9 is closed; if the two signals are different, gate 12 supplies a 0 and switch 9 remains open.

Closing of switch 9 is provided by means of a flip-flop 13, of the set-reset type (RS), i.e. with resetting to zero and setting to 1. This flip-flop is controlled on its first R (reset) input by the frame-return pulse, coming from terminal P and on its second S (set) input by the signal from gate 13, via the AND gate 14. A transition from 0 to 1 at input R puts the output of the flip-flop to position 0 (switch 9 remains open). A transition from 0 to 1 at the S input puts the output of the flip-flop to position 1 (switch 9 is closed).

The AND gate 14, placed between gate 12 and RS flip-flop 13 prevents any random operation. It only allows transmission to the RS flip-flop of the output signal from gate 12 in the presence of a logic 1 signal on its second input. As long as the inhibition signal In is at 0, the AND gate 14 prevents operation of the RS flip-flop 13.

When the circuit of the invention is brought into service, the first logic 1 which leaves gate 12 is stored in the flip-flop and allows closing of switch 9. When, subsequently, the output voltage V of the demodulator is equal to the reference voltage $V_{ref}$, the output voltage of amplifier 4 is zero, as near as makes no difference ($\pm\epsilon$), which makes the output of gate 12 indeterminate, but switch 9 is maintained closed by the RS flip-flop.

The diagrams of FIG. 3 will make it easier to understand the operation. The time is shown therein as abscissa and the changes of levels as ordinates signify either the modification of a phenomenon or the passage from one logic level to another logic level: 0 to 1 for example.

Diagram 3a represents the frame return, between times $t_1$ and $t_3$. Diagram 3b represents the time during which the frequency $f_q$ of the quartz is available. Diagram 3c shows the sampling pulse: it corresponds to the frame return, during which the control loop, or feedback, is balanced by charging or discharging capacitor C.

Diagram 3d represents the state of the inhibition input In and shows that flip-flop 13, which has assumed state 0 on the rising front of the frame return (switch 9 open), will remain in this state at least for the period included between times $t_1$ and $t_2$, which leaves time for the demodulator to latch on to the frequency of the quartz.

Diagram 3e shows the charging of capacitor C. As soon as the sign of voltage U is correct, the transition 0–1 of the exclusive OR gate 12 causes flip-flop 13 to pass to 1, which closes the loop through switch 9. The charging of capacitor C continues until the voltage $V_{ref}$ is obtained at the output, which corresponds to the correction voltage U at the input $E_2$ of the demodulator.

Diagram 3f shows the state of the output of gate 12.

Diagram 3g shows the output of flip-flop 13 and so the state of switch 9. Flip-flop 13 is reset at the beginning of the frame, then set by the last of the transitions from 0 to 1 of gate 12 and of the inhibition signal In.

Finally, there are cases where the device does not exactly follow the diagrams of FIG. 3:

In a first case, it may happen that capacitor C has a charge very far removed from the correct charge, for example during start-up. Gate 12 may remain at zero for several frames and the diagrams of FIG. 3 only represent in that case the end part of the phenomenon.

In a second case, the output of gate 12 is on logic 1, which position it had acquired during the preceding frame returns. The flip-flop is then set by the transition 0–1 of the inhibition signal as shown in FIG. 3g.

The device of the invention also functions in the direction opposite that which has been described i.e. in the direction of a conversion of voltage into frequency, particularly for constructing the SECAM coders used in television cameras and in video taperecorders.

The demodulation circuit, may be used as and may form the circuit for modulating chrominance signals in a color television camera.

It is designed to be constructed with integrated circuit technology on a semiconductor crystal, the quartz and capacitor C being the only components which are external to the integrated circuit.

It finds one of its applications in chrominance-signal demodulators in the SECAM system of color television. All the adjustments and all the drifts are done away with in these demodulators.

The invention may apply particularly to a demodulating device composed of a phase-locked loop to which it brings the following advantages:

the demodulating slope as well as the pickup range may be easily made dependent on a calibrated frequency (for instance a quartz oscillator);

the pickup range being then correctly centered (even if the various components are not precise) on the frequency band to be demodulated; the open loop gain may be reduced, which avoids the appearance of poles in the transfer function of the device, which poles alter the damping performance of the pulse response.

The present invention is not limited to the embodiments which have been explicitly described above; it includes the different variations and generalizations thereof included in the field of the following claims.

What is claimed is:

1. A frequency demodulation device for supplying a voltage proportional to a frequency to be demodulated, comprising a source (3) of a reference frequency, a phase comparator (7) having a first input, a second input, and an output, an oscillator (8) having a first control input for receiving a first voltage, a second control input for receiving a second voltage, and an output connected to the second input of the phase comparator, said oscillator being adapted to supply at its output a frequency proportional to the ratio between said first and second voltages, said second control input being connected to the output of the phase comparator, a feedback loop between the output of the phase comparator and the first control input of the oscillator, this loop comprising a differential amplifier, a switching means and a storing means; said amplifier having a first input connected to the output of the phase comparator, a second input connected to a reference voltage, and an output supplying an output voltage to said storing means; said storing means being adapted for storing a voltage and for delivering the stored voltage to the first input of the oscillator; said switching means being controllable for opening or closing the feedback loop;

sampling means adapted to connect the reference frequency source to the first input of the phase comparator and to activate the switching means to close the loop, during sampling time intervals, and adapted to apply a frequency to be demodulated to the first input of the phase comparator and to activate said switching means to open the feedback loop outside said sampling time intervals.

2. The demodulation device as claimed in claim 1 further comprising a potentiometric divider receiving the reference voltage, and a switch controlled by the sampling means for applying to an output of the demodulation device a fraction of the reference voltage during the sampling time intervals, and the output of the phase comparator outside the sampling time intervals.

3. The demodulation device as claimed in claim 1 wherein the storage means is a capacitor.

4. The demodulation device as claimed in claim 1 wherein there is further provided a safety circuit adapted to allow closing of the feedback loop only if the stored voltage has a given sign.

5. The demodulation device as claimed in claim 4 wherein the safety circuit comprises:
two voltage comparators which compare the output voltage of the amplifier respectively with each of two predetermined voltages, said voltage comparators having outputs supplying logic levels indicating the results of the comparisons;
a complemented exclusive-OR gate receiving the outputs of the voltage comparators;
an AND gate having one input connected to the exclusive-OR gate and another input receiving an inhibition signal during time intervals which are slightly delayed with respect to the sampling time intervals;
an RS flip-flop having one input activated during the sampling time intervals and another input connected to the AND gate;
a further switch connected in the feedback loop and activated by the output of the RS flip-flop.

6. The demodulation device as claimed in claim 1 formed as an integrated circuit on a semiconductor crystal, the only external components of which are the source of reference frequency and the storing means.

* * * * *